(12) United States Patent
Jung et al.

(10) Patent No.: US 11,999,882 B2
(45) Date of Patent: Jun. 4, 2024

(54) DISPLAY DEVICE, LAMINATION DEVICE, AND LAMINATION METHOD OF LAMINATION DEVICE

(71) Applicant: Samsung Display Co., Ltd., Yongin-Si (KR)

(72) Inventors: Kyu-Ho Jung, Osan-si (KR); Wonjin Kim, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 286 days.

(21) Appl. No.: 17/328,318

(22) Filed: May 24, 2021

(65) Prior Publication Data

US 2022/0056311 A1 Feb. 24, 2022

(30) Foreign Application Priority Data

Aug. 19, 2020 (KR) .................. 10-2020-0103872

(51) Int. Cl.
*C09J 7/24* (2018.01)
*B32B 7/12* (2006.01)
(Continued)

(52) U.S. Cl.
CPC ................ *C09J 7/243* (2018.01); *B32B 7/12* (2013.01); *B32B 37/1284* (2013.01);
(Continued)

(58) Field of Classification Search
CPC . C09J 7/243; H01L 51/56; B32B 7/12; B32B 37/1284
(Continued)

(56) References Cited

U.S. PATENT DOCUMENTS 7,892,385 B2* 2/2011 Baek .................. C09J 7/10
156/289
2015/0137102 A1* 5/2015 Yang ................ B32B 37/14
156/227
(Continued)

FOREIGN PATENT DOCUMENTS

KR 1020190096850 A 8/2019
KR 1020190130105 A 11/2019
(Continued)

*Primary Examiner* — Tahseen Khan
(74) *Attorney, Agent, or Firm* — CANTOR COLBURN LLP

(57) ABSTRACT

A display device in which a curved area having a curved shape and a straight area having a planar shape are defined includes a display panel including a first curved portion overlapping the curved area and a first straight portion overlapping the straight area, a window disposed on the display panel and including a second curved portion overlapping the curved area and a second straight portion overlapping the straight area, and an adhesive layer disposed between the display panel and the window. The adhesive layer includes a first adhesive layer disposed between the first and second straight portions and couples the first straight portion to the second straight portion, and a second adhesive layer disposed in a first space between the first curved portion and the second curved portion and a second space between the first adhesive layer and the second straight portion.

9 Claims, 16 Drawing Sheets

(51) Int. Cl.
  *B32B 37/12*   (2006.01)
  *C09J 7/25*    (2018.01)
  *H01L 51/52*   (2006.01)
  *H01L 51/56*   (2006.01)
  *H10K 50/84*   (2023.01)
  *H10K 71/00*   (2023.01)
  *H10K 102/00*  (2023.01)

(52) U.S. Cl.
  CPC ............ *C09J 7/255* (2018.01); *H10K 50/841* (2023.02); *H10K 71/00* (2023.02); *B32B 2037/1253* (2013.01); *B32B 2457/206* (2013.01); *C09J 2423/046* (2013.01); *C09J 2423/106* (2013.01); *C09J 2467/006* (2013.01); *H10K 2102/311* (2023.02)

(58) Field of Classification Search
  USPC ........................................................ 428/174
  See application file for complete search history.

(56) References Cited

U.S. PATENT DOCUMENTS

2019/0348641 A1\* 11/2019 Jung .................... G06F 1/1626
2020/0203672 A1\*  6/2020 Kuon ................. H10K 50/8426
2020/0257148 A1\*  8/2020 Kim .................... H10K 50/841
2021/0384480 A1\* 12/2021 Lee ........................ B32B 37/10

FOREIGN PATENT DOCUMENTS

KR   1020210150647 A   12/2021
KR   1020210152065 A   12/2021

\* cited by examiner

DISPLAY DEVICE, LAMINATION DEVICE, AND LAMINATION METHOD OF LAMINATION DEVICE

This application claims priority to Korean Patent Application No. 10-2020-0103872, filed on Aug. 19, 2020, and all the benefits accruing therefrom under 35 U.S.C. § 119, the content of which in its entirety is herein incorporated by reference.

BACKGROUND

1. Field

Embodiments of the invention herein relate to a display device, a lamination device, and a lamination method of the lamination device, and more particularly, to a display device having improved transmittance in a curved section, a lamination device used to manufacture the display device and a lamination method using the lamination device.

2. Description of the Related Art

Various display devices used in multimedia apparatuses such as televisions, mobile phones, tablet computers, and navigation units, have been developed. Particularly, in recent years, a development of display devices having various modified shapes such as a curved or folded shape is being developed.

Some of various components constituting such a curved display device may have a curved shape. Particularly, a window provided to protect a display panel also has a curved shape according to the curved shape of the display device. Accordingly, it is desired to laminate the modified window and the display panel.

SUMMARY

Embodiments of the invention provide a display device in which the transmittance in a curved section is prevented from deteriorating.

Embodiments of the invention also provide a lamination device used to manufacture a display device having a curved shape and a lamination method using the lamination device.

An embodiment of the invention provides a display device in which a curved area having a curved shape and a straight area having a planar shape are defined. The display device includes a display panel, a window, and an adhesive layer. The display panel includes a first curved portion overlapping the curved area and a first straight portion overlapping the straight area, and a window is disposed on the display panel and includes a second curved portion overlapping the curved area and a second straight portion overlapping the straight area. The adhesive layer is disposed between the display panel and the window. The adhesive layer includes a first adhesive layer and a second adhesive layer. The first adhesive layer is disposed between the first straight portion and the second straight portion and couples the first straight portion to the second straight portion, and the second adhesive layer is disposed in a first space between the first curved portion and the second curved portion and a second space between the first adhesive layer and the second straight portion.

In an embodiment, the first space may include a dam formation space corresponding to an end of the first curved portion and an injection space corresponding to a region other than the dam formation space.

In an embodiment, the first space may include a space in which the second adhesive layer and the first curved portion are in direct contact with each other.

In an embodiment, the first adhesive layer may be further disposed in the dam formation space.

In an embodiment, the second adhesive layer may be disposed between the second curved portion and the first adhesive layer within the dam formation space and may be disposed between the second curved portion and the first curved portion within the injection space.

In an embodiment, the second adhesive layer may include a high-viscosity adhesive layer disposed in the dam formation space, and a low-viscosity adhesive layer which is disposed in the injection space and has viscosity lower than a viscosity of the high-viscosity adhesive layer.

In an embodiment, the first adhesive layer may be further disposed in the curved area.

In an embodiment, the second adhesive layer may be disposed between the second curved portion and the first adhesive layer within the first space.

In an embodiment, the second adhesive layer may include a high-viscosity adhesive layer disposed in the dam formation space, and a low-viscosity adhesive layer which is disposed in the injection space and has viscosity lower than a viscosity of the high-viscosity adhesive layer.

In an embodiment of the invention, a lamination device manufactures a display device in which a curved area having a curved shape and a straight area having a planar shape are defined. The lamination device includes a first support unit, a second support unit, an injection unit, and a curing unit. On the first support unit, a display panel which includes a first curved portion overlapping the curved area and a first straight portion overlappings the straight area and a first adhesive layer disposed on the first straight portion. On the second support unit, a window which includes a second curved portion overlapping the curved area and a second straight portion overlapping the straight area is disposed. The injection unit injects an adhesive material into a first space between the first curved portion and the second curved portion and a second space between the first adhesive layer and the second straight portion. The curing unit cures the injected adhesive material and forms a second adhesive layer.

In an embodiment, the first support unit may include an expansion pad which expands due to air injection, where the first straight portion is disposed on the expansion pad and is laminated to the second straight portion when the expansion pad expands.

In an embodiment, the first support unit may include a fixed pad of which a position is fixed, where the first curved portion is disposed on the fixed pad, and a gap between the first curved portion and the second curved portion remains constant when the expansion pad expands.

In an embodiment, the first space may include a dam formation space corresponding to an end of the first curved portion and an injection space corresponding to a region other than the dam formation space, and the injection unit may include a first injection unit which injects a high-viscosity adhesive material into the dam formation space, and a second injection unit which injects a low-viscosity adhesive material, which has viscosity lower than the high-viscosity adhesive material, into the injection space.

In an embodiment, the first adhesive layer may be further disposed in the curved area, the first injection unit may inject the high-viscosity adhesive material into a space between the second curved portion and the first adhesive layer within the dam formation space, and the second injection unit may inject the low-viscosity adhesive material into a space between the second curved portion and the first curved portion within the injection space.

In an embodiment, the adhesive material may be an ultraviolet ("UV")-durable material, and the curing unit may include a first curing unit which emits UV light to the adhesive material and forms the second adhesive layer.

In an embodiment, the first adhesive layer may include a UV-curable material, and the curing unit may further include a second curing unit which emits UV light to the first adhesive layer and cures the first adhesive layer.

In an embodiment of the invention, a lamination method includes disposing, on a first support unit, a display panel which includes a first curved portion overlapping the curved area and a first straight portion overlapping the straight area and on which a first adhesive layer is disposed, disposing, on a second support unit, a window which includes a second curved portion overlapping the curved area and a second straight portion overlapping the straight area, coupling the first support unit to the second support unit to laminate the first adhesive layer to the window, using an injection unit to inject an adhesive material into a first space between the first curved portion and the second curved portion and a second space between the first adhesive layer and the second straight portion, using a curing unit to cure the adhesive material, thereby laminating the display panel to the window, and separating the coupled first and second support units from each other.

In an embodiment, the first support unit may include an expansion pad which expands due to air injection, and the lamination method may include using the expansion pad to laminate the first straight portion to the second straight portion.

In an embodiment, the first space may include a dam formation space corresponding to an end of the first curved portion and an injection space corresponding to a region other than the dam formation space, and the injecting the adhesive material may include injecting a high-viscosity adhesive material into the dam formation space, and injecting a low-viscosity adhesive material into the injection unit.

In an embodiment, the adhesive material may be a UV-durable material, and the curing the adhesive material may include emitting UV light to the high-viscosity adhesive material to cure the same, and emitting UV light to the low-viscosity adhesive material to cure the same.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
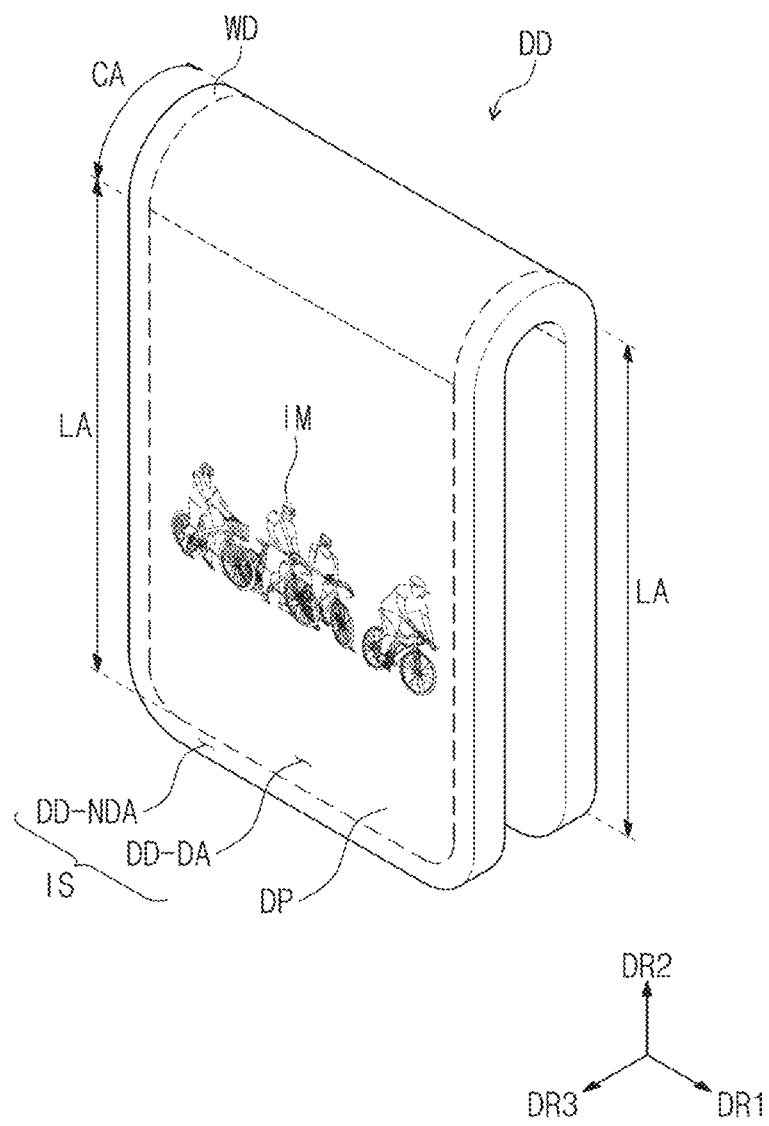
FIG. 1 is a perspective view showing an embodiment of a display device according to the invention.

It will be understood that when an element (or a region, a layer, a portion, or the like) is referred to as "being on", "connected to" or "coupled to" another element, it can be directly disposed on, connected or coupled to the other element, or intervening elements may be disposed therebetween.

Like numbers refer to like elements throughout. Also, in the drawings, the thicknesses, ratios, and dimensions of the elements are exaggerated for effective description of the technical contents.

The term "and/or" includes any and all combinations of one or more of the associated listed items.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the present disclosure. The singular forms include the plural forms unless the context clearly indicates otherwise.

Also, terms such as "below", "lower", "above", and "upper" may be used to describe the relationships of the components illustrated in the drawings. These terms have a relative concept, and are described on the basis of the directions indicated in the drawings.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the accompanying drawings.

Figure 2A:
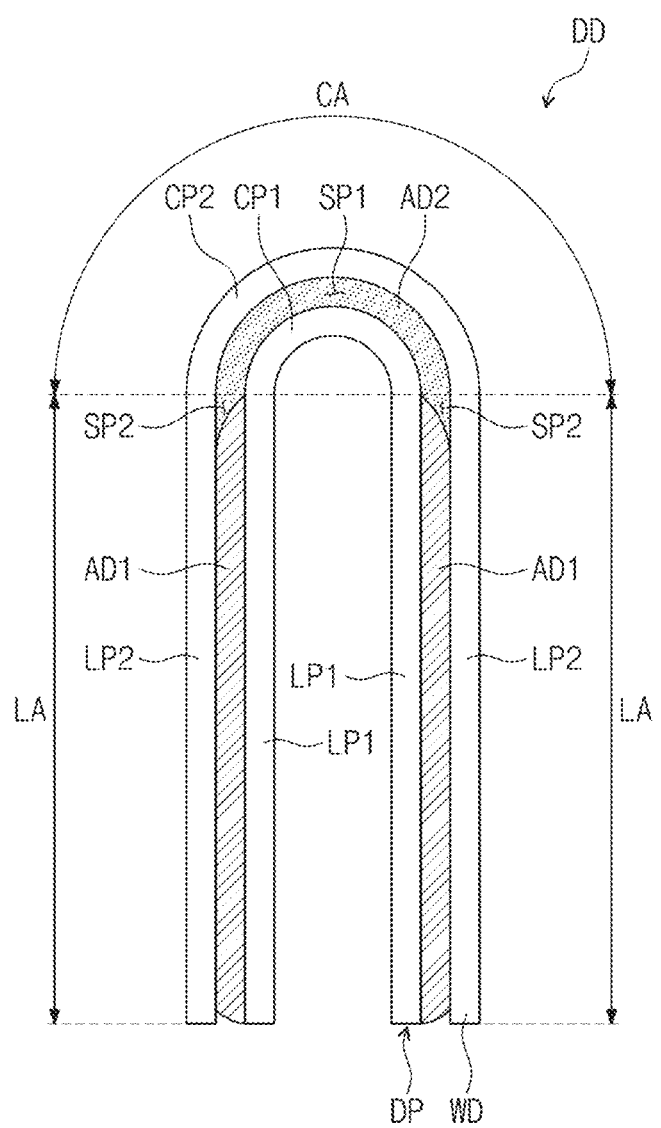
FIG. 2A is a cross-sectional view of an embodiment of a display device according to the invention.
Figure 2B:
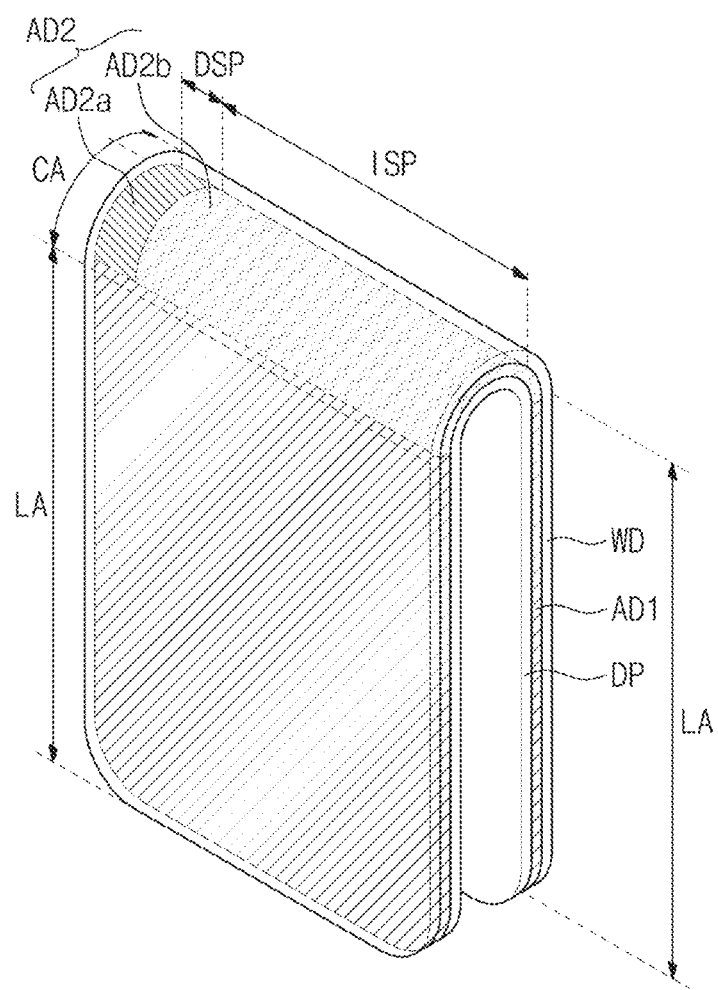
FIG. 2B is a perspective view showing an embodiment of a display device according to the invention.
Figure 2C:
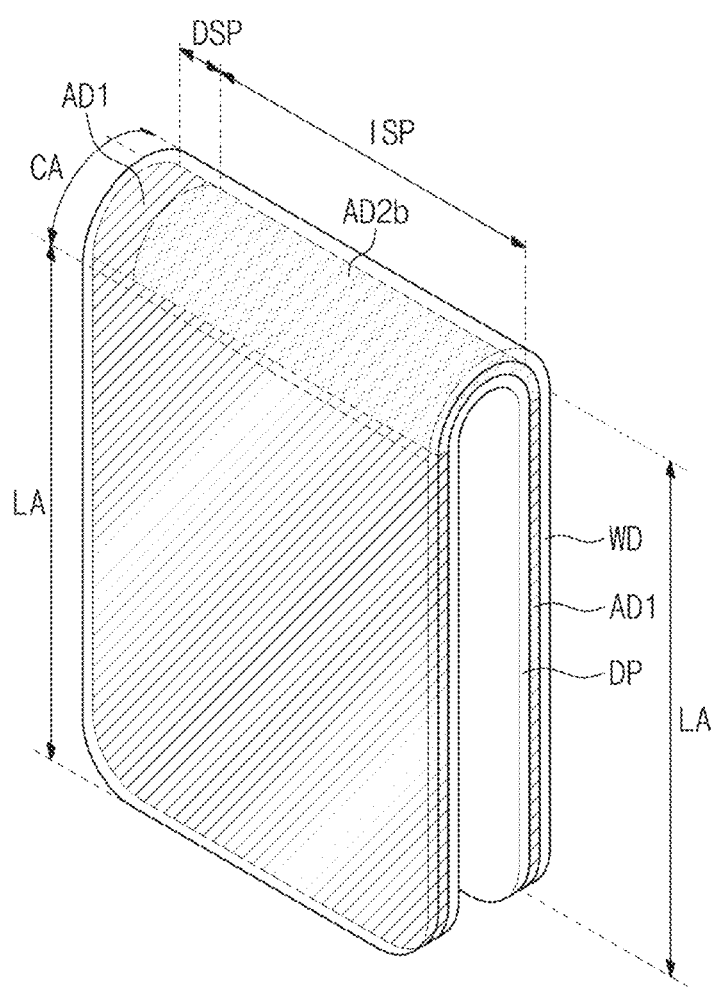
FIG. 2C is a perspective view showing an embodiment of a display device according to the invention.

FIG. 1 is a perspective view showing an embodiment of a display device according to the invention. FIG. 2A is a cross-sectional view of an embodiment of the display device according to the invention, and FIGS. 2B and 2C are perspective views showing an embodiment of the display device according to the invention.

Referring to FIGS. 1 and 2A, a display device DD includes a window WD and a display panel DP. FIG. 1 illustrates, in one embodiment of a curved display device DD, the display device DD in which a curved area CA having a curved shape and straight areas LA having a planar shape are defined. Each of the window WD and the display panel DP may include a curved portion corresponding to the curved area CA and straight portions corresponding to the straight areas LA, respectively. Also, each may have a curved shape different from that of FIG. 1. FIG. 1 illustrates the display device DD having one curved area CA and two straight areas LA, but the invention is not limited thereto. In an embodiment, the display device DD of an embodiment may include a plurality of curved areas CA, for example. Also, the display device DD of an embodiment may include one or more than two straight areas LA.

Referring to FIGS. 1 and 2A, in the display device DD of an embodiment, a display surface IS on which an image IM is displayed is parallel to a plane defined by a first direction axis DR1 and a second direction axis DR2. In an embodiment, the display surface IS of the display device DD may include a display area DD-DA in which the image IM is displayed and a non-display area DD-NDA peripheral to the display area DD-DA. A normal direction of the display surface IS, that is, a thickness direction of the display device DD is indicated as a third direction axis DR3. However, the directions indicated as the first to third directional axes DR1, DR2, and DR3 may have a relative concept and thus may be changed to other directions.

The window WD may have a shape corresponding to a shape of the display panel DP and face the display panel DP. The window WD includes a second curved portion CP2 that overlaps the curved area CA and straight portions LP2 that overlap the two straight areas LA, respectively. The window WD may include an optically transparent insulating material. In an embodiment, the window WD may include glass or plastic, for example. The window WD may have a multilayer structure or a single layer structure. In an embodiment, the window WD may include a plurality of plastic films which are coupled by an adhesive, or a glass substrate and a plastic film which are coupled to each other by an adhesive, for example.

The display panel DP may generate the image IM and provide the generated image to the display surface IS. The display panel DP may provide the generated image in the third direction axis DR3. In an embodiment, the display panel DP may be an organic light emitting display panel, for example. However, the invention is not limited thereto, and the display panel DP may be a liquid crystal display panel, a plasma display panel, an electrophoretic display panel, a microelectromechanical system ("MEMS") display panel, an electrowetting display panel, or the like. Hereinafter, the display panel DP is described as an organic light emitting display panel. Referring to FIG. 2A, the display panel DP of an embodiment includes a first curved portion CP1 that overlaps the curved area CA and straight portions LP1 that overlap the two straight areas LA, respectively. However, the shape of the display panel DP is not limited thereto, and the display panel DP may be a flexible display panel which may be curved or unfolded. In an embodiment, the flexible display panel DP may be curved to be inserted into the curved window WD, for example.

The display panel DP includes a display element, for example, a light emitting element. The light emitting element includes at least organic light emitting diodes. A thin film encapsulation layer seals the light emitting element. The thin film encapsulation layer includes at least one inorganic layer (hereinafter, also referred to as an encapsulation inorganic layer). The thin film encapsulation layer includes at least one organic layer (hereinafter, also referred to as an encapsulation organic layer). The encapsulation inorganic layer protects the light emitting element from moisture/oxygen, and the encapsulation organic layer protects the light emitting element from impurities such as dust particles. In an embodiment, the encapsulation inorganic layer may include a silicon nitride layer, a silicon oxynitride layer, a silicon oxide layer, a titanium oxide layer, an aluminum oxide layer, or the like, for example. The encapsulation organic layer may include an acrylic-based organic layer, but the invention is not limited thereto.

Also, the display device DD may further include an input sensor layer (not shown). The input sensor layer may be disposed on the display panel DP. The input sensor layer may sense an external input applied from the outside. The external input may be an input of a user. In an embodiment, the input of the user may include various types of external inputs such as a portion of the user's body, light, heat, a pen, or pressure. The input sensor layer may be disposed on the display panel DP through a continuous process. In this case, the input sensor layer may be expressed as being disposed directly on the display panel DP. Here, "being disposed directly on" may represent that an intervening third component is not disposed between the sensor layer and the display layer DP. That is, a separate adhesive member may not be disposed between the input sensor layer and the display panel DP. However, the invention is not limited thereto, and an adhesive member may be further disposed between the input sensor layer and the display panel DP. Hereinafter, for convenience of description, each of the straight portions of the display panel DP overlapping the two straight areas LA is also referred to as a "first straight portion LP1", and each of the straight portions of the window WD overlapping the two straight areas LA is also referred to as a "second straight portion LP2". FIG. 1 illustrates that the two straight areas LA are symmetric with respect to the curved area CA, but the invention is not limited thereto. In an embodiment, the display device DD of an embodiment may include two straight areas having different lengths, for example.

The display device DD may further include an adhesive layer disposed between the display panel DP and the window WD.

The adhesive layer is disposed between the display panel DP and the window WD to couple the display panel DP to the window WD. The adhesive layer may include a first adhesive layer AD1 and a second adhesive layer AD2. The first adhesive layer AD1 may be disposed between the first straight portion LP1 and the second straight portion LP2 to couple the first straight portion LP1 to the second straight portion LP2. The second adhesive layer AD2 may be disposed in a first space SP1 between the first curved portion CP1 and the second curved portion CP2 to couple the first curved portion CP1 to the second curved portion CP2. Also, the second adhesive layer AD2 may be disposed in a second space SP2 between the first adhesive layer AD1 and the second straight portion LP2 to couple the second straight portion LP2 to the first adhesive layer AD1. The first space SP1 may include a space in which the second adhesive layer AD2 is in direct contact with the first curved portion CP1.

The first adhesive layer AD1 may be an optically clear adhesive ("OCA") layer. The second adhesive layer AD2 may be an optically clear adhesive resin layer ("OCRL"). Each of the first and second adhesive layers AD1 and AD2 may include at least one of an acrylic-based adhesive, a silicone-based adhesive, or a urethane-based adhesive. Each of first and second adhesive layers AD1 and AD2 may further include inorganic particles. In an embodiment, each of first and second adhesive layers AD1 and AD2 may further include inorganic particles such as $SiO_2$ and $TiO_2$ and thus have improved strength, for example.

In a case where the first adhesive layer AD1 is an OCA layer, on the basis of the characteristics of the OCA layer in a solid film state, the second space SP2 may be defined, near the curved area CA, between the first adhesive layer AD1 and the second straight portion LP2 while the display panel DP is coupled to the window WD. In a case where the second adhesive layer AD2 is an OCRL, the second adhesive layer AD2 may be a layer which is provided by injecting a liquid-state optically clear adhesive resin ("OCR") into the first and second spaces SP1 and SP2 and then curing the same. Accordingly, the second adhesive layer AD2 is disposed in the first space SP1 and the second space SP2. The second adhesive layer AD2 disposed in the first space SP1 prevents the light provided from the display panel DP from being diffusely reflected by a boundary surface between the display panel DP and the first space SP1 and a boundary surface between the first space SP1 and the window WD. Accordingly, the transmittance of the display device DD may be prevented from decreasing due to the diffuse reflection of the light. The second adhesive layer AD2 disposed in the second space SP2 prevents the light provided from the display panel DP from being diffusely reflected by a boundary surface between the first adhesive layer AD1 and the second space SP2 and a boundary surface between the second space SP2 and the window WD. Accordingly, the transmittance of the display device DD may be prevented from decreasing due to the diffuse reflection of the light.

Referring to FIGS. 2A and 2B, the first space SP1 may include a dam formation space DSP corresponding to one end of the first curved portion CP1 and an injection space ISP corresponding to a region other than the dam formation space DSP.

The second adhesive layer AD2 may include a high-viscosity adhesive layer AD2a and a low-viscosity adhesive layer AD2b having viscosity lower than that of the high-viscosity adhesive layer AD2a. The second adhesive layer AD2 may couple the first curved portion CP1 of the display panel DP to the second curved portion CP2 of the window WD. The second adhesive layer AD2 may be in direct contact with the first curved portion CP1 in the first space SP1. In this case, the high-viscosity adhesive layer AD2a may be disposed in the dam formation space DSP defined between the second curved portion CP2 and the first curved portion CP1, and the low-viscosity adhesive layer AD2b may be disposed in the injection space ISP defined between the second curved portion CP2 and the first curved portion CP1. In one embodiment of the invention, the high-viscosity adhesive layer AD2a may have viscosity of about 60,000 centipoise (cps). In an embodiment, the low-viscosity adhesive layer AD2b may have viscosity of about 500 cps, for example.

Referring to FIGS. 2A and 2C, the first adhesive layer AD1 may be further disposed in the dam formation space DSP. In this case, the second adhesive layer AD2 may be disposed in the injection space ISP. Here, the second adhesive layer AD2 may be the low-viscosity adhesive layer AD2b. In this case, the first adhesive layer AD1 disposed in the dam formation space DSP and the low-viscosity adhesive layer AD2b disposed in the injection space ISP may couple the first curved portion CP1 of the display panel DP and the second curved portion CP2 of the window WD. However, the arrangement of the low-viscosity adhesive layer AD2b is not limited to that of FIG. 2C. In an embodiment, the low-viscosity adhesive layer AD2b may be further disposed in the dam formation space DSP, for example. In this case, the low-viscosity adhesive layer AD2b may be disposed between the first adhesive layer AD1 and the first curved portion CP1 within the dam formation space DSP.

Figure 3:
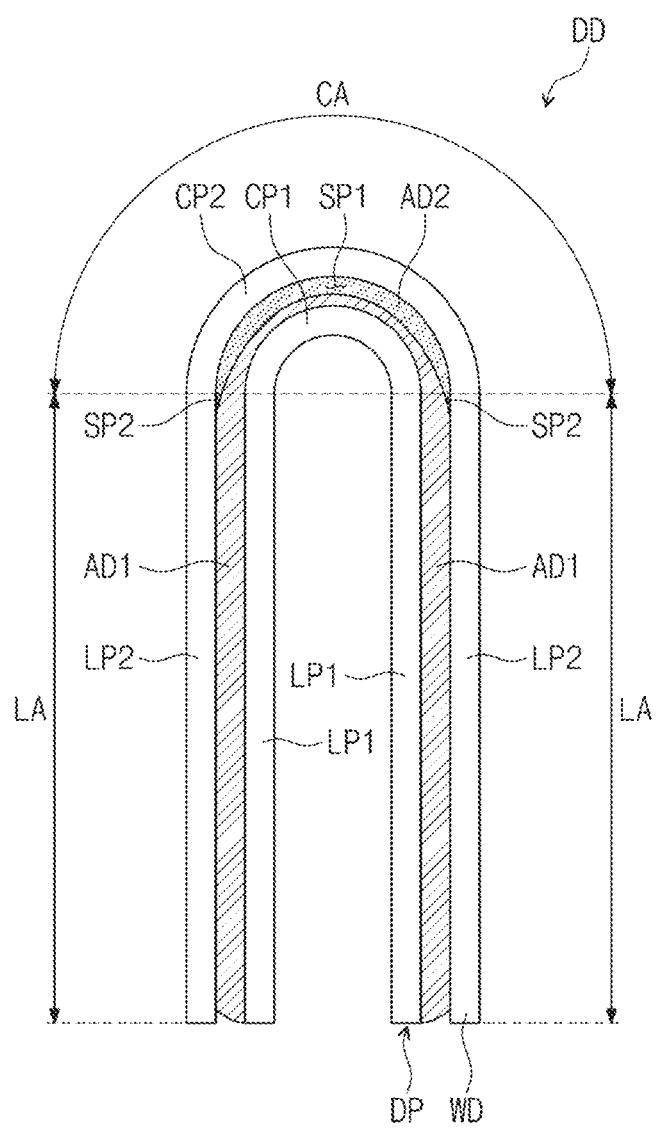
FIG. 3 is a cross-sectional view of an embodiment of a display device according to the invention.

FIG. 3 is a cross-sectional view of an embodiment of a display device according to the invention. Referring to FIG. 3, the first adhesive layer AD1 may be further disposed in the curved area CA. The first space SP1 may be a space defined by the first adhesive layer AD1 and the second curved portion CP2. In a case where the first adhesive layer AD1 is further disposed in the curved area CA, but the curvature of the curved area CA of the display panel DP is large, the second space SP2 may be defined between the first adhesive layer AD1 and the second straight portion LP2 or the first space SP1 may be defined between the first adhesive layer AD1 and the second curved portion CP2 when the display panel DP is coupled to the window WD. The second adhesive layer AD2 may be disposed within the first space SP1 defined between the second curved portion CP2 and the first adhesive layer AD1 in the curved area CA. The second adhesive layer AD2 may be disposed in the second space SP2 defined between the first adhesive layer AD1 and the second straight portion LP2 in the straight area LA. The second adhesive layer AD2 disposed in the first space SP1 prevents the light provided from the display panel DP from being diffusely reflected by a boundary surface between the first adhesive layer AD1 and the first space SP1 and a boundary surface between the first space SP1 and the window WD. Accordingly, the transmittance of the display device DD may be prevented from decreasing due to the diffuse reflection of the light. The second adhesive layer AD2 disposed in the second space SP2 prevents the light provided from the display panel DP from being diffusely reflected by a boundary surface between the first adhesive layer AD1 and the second space SP2 and a boundary surface between the second space SP2 and the window WD. Accordingly, the transmittance of the display device DD may be prevented from decreasing due to the diffuse reflection of the light.

FIGS. 4A to 4E are process views illustrating a process of laminating a display panel and a window using a lamination device.

Figure 4A:
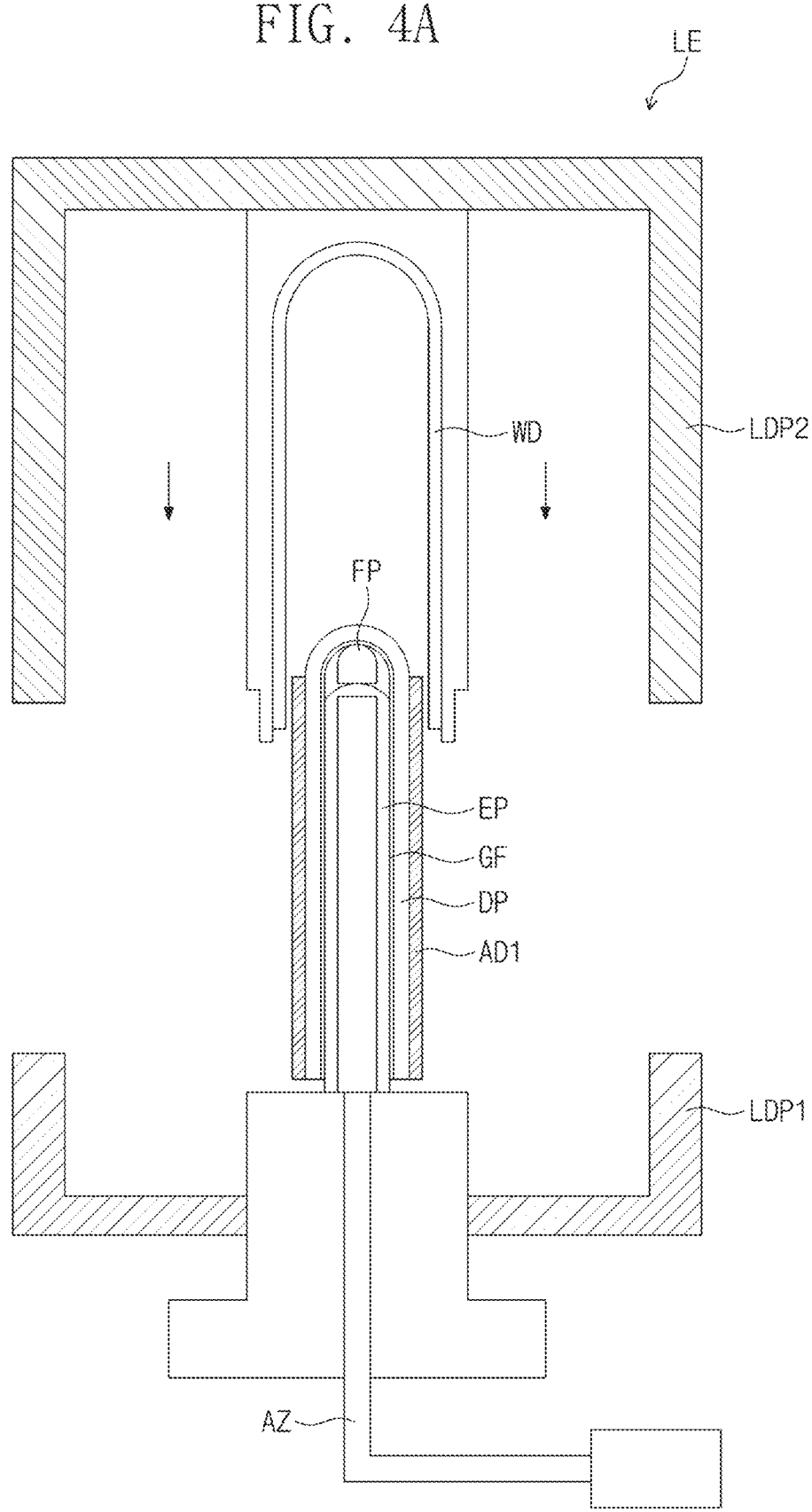
FIGS. 4A to 4E are process views illustrating a process of laminating a display panel and a window using a lamination device.

Referring to FIGS. 2A and 4A, the lamination device LE for manufacturing the display device DD in which the curved area CA and the straight area LA are defined may include a first support unit LDP1 and a second support unit LDP2.

Referring to FIG. 4A, the display panel DP, on which the first adhesive layer AD1 and a guide film GF are disposed, may be disposed (e.g., loaded) on the first support unit LDP1. The display panel DP includes the first curved portion CP1 (refer to FIG. 2A) that overlaps the curved area CA and the first straight portion LP1 that overlaps the straight area LA. The display panel DP may be a display panel DP manufactured to be flexible. In one embodiment of the invention, the first adhesive layer AD1 is disposed on the first straight portion LP1 of the display panel DP. The first adhesive layer AD1 may be an OCA layer. However, in one embodiment of the invention, the display panel DP is loaded on the first support unit LDP1, and then, the first adhesive layer AD1 may be disposed on the first straight portion LP1 of the display panel DP.

In one embodiment of the invention, the guide film GF may be disposed between the display panel DP and the first support unit LDP1. The guide film GF may include an organic material. In an embodiment, the guide film GF may include polypropylene, polyethylene, or polyethylene terephthalate, for example. However, the material of the guide film GF is not necessarily limited to the examples described above. An adhesive member (not shown) may be further disposed between the guide film GF and the display panel DP. In an embodiment, the adhesive member may be an acrylic-based adhesive member, for example.

The first support unit LDP1 may include an air nozzle AZ through which air is injected from the outside. An air hole (not shown) from which the injected air is discharged may be defined in the first support unit LDP1, and the first support unit LDP1 may further include an expansion pad EP that is expanded by the air discharged from the air hole. Here, the air hole suctions the air from the outside through the air nozzle AZ, and consequently, the display panel DP may be fixed to the first support unit LDP1.

The display panel DP is disposed on the first support unit LDP1 such that the first straight portion LP1 (refer to FIG. 2A) may correspond to the expansion pad EP. The first support unit LDP1 may further include a fixed pad FP of which a position is fixed. The display panel DP is disposed on the first support unit LDP1 such that the first curved portion CP1 may correspond to the fixed pad FP.

The window WD, which includes the second curved portion CP2 that overlaps the curved area CA (refer to FIG. 2A) and the second straight portion LP2 (refer to FIG. 2A) that overlaps the straight area LA, may be loaded on the second support unit LDP2.

Figure 4B:
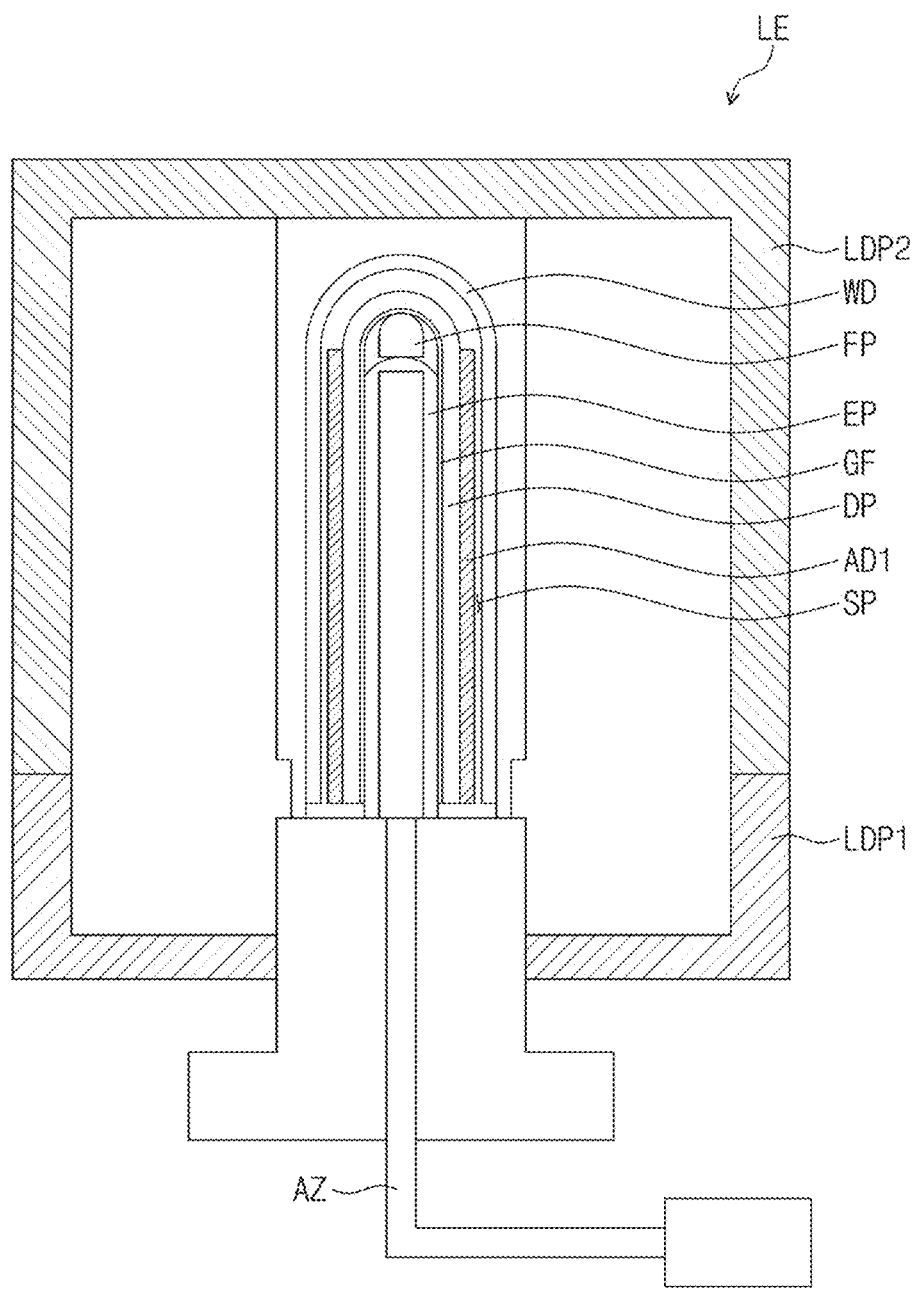

Referring to FIGS. 2A and 4B, the first support unit LDP1 on which the display panel DP is loaded may be coupled to the second support unit LDP2 on which the window WD is loaded. Here, a spaced gap SP may be defined between the display panel DP and the window WD. In one embodiment of the invention, the spaced gap SP may include a space between the first adhesive layer AD1 and the second straight portion LP2 of the window WD and a space between the first curved portion CP1 of the display panel DP and the second curved portion CP2 of the window WD.

Figure 4C:
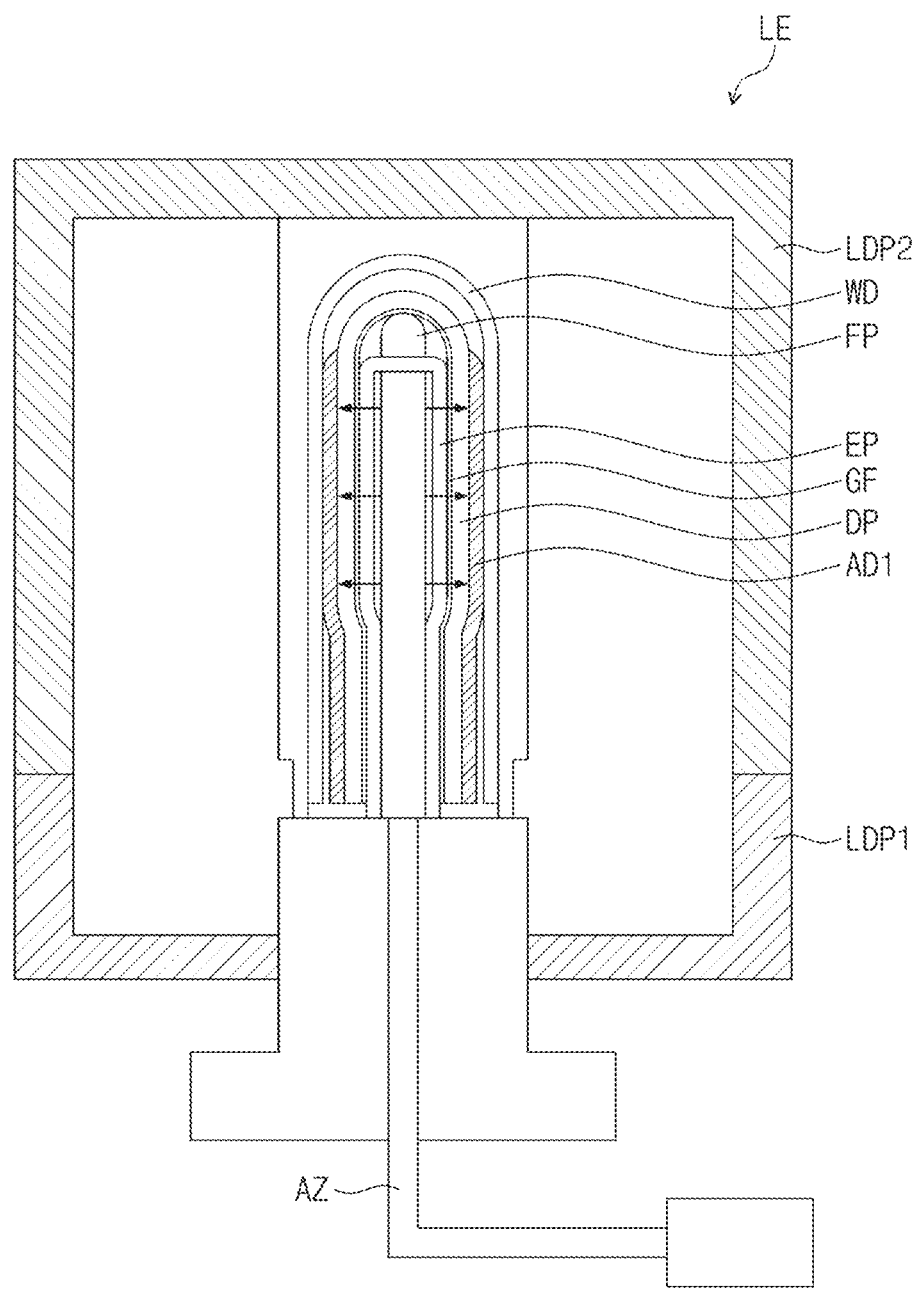

Referring to FIGS. 2A and 4C, the air is injected from the outside through the air nozzle AZ, and consequently, the expansion pad EP belonging to the first support unit LDP1 may expand. Here, to prevent generation of bubbles between the display panel DP and the window WD, the expansion pad EP may sequentially expand from the top to the bottom with respect to FIG. 4C. When the expansion pad EP is expanded by the air, the first straight portion LP1 of the display panel DP having the flexibility moves toward the second straight portion LP2 of the window WD loaded on the second support unit LDP2. Thus, the first adhesive layer AD1 disposed on the first straight portion LP1 of the display panel DP contacts the second straight portion LP2 of the window WD. That is, the first straight portion LP1 is laminated to the second straight portion LP2 by the first adhesive layer AD1 disposed on the first straight portion LP1. Here, unlike the expansion pad EP, the fixed pad FP is not expanded even though the air is injected through the air nozzle AZ. Thus, the position of the first curved portion CP1 of the display panel DP disposed on the first support unit LDP1 to correspond to the fixed pad FP remains constant. Accordingly, a gap between the first curved portion CP1 of the display panel DP and the second curved portion CP2 of the window WD before the expansion pad EP expands may be the same as a gap therebetween after the expansion pad EP expands.

Figure 4D:
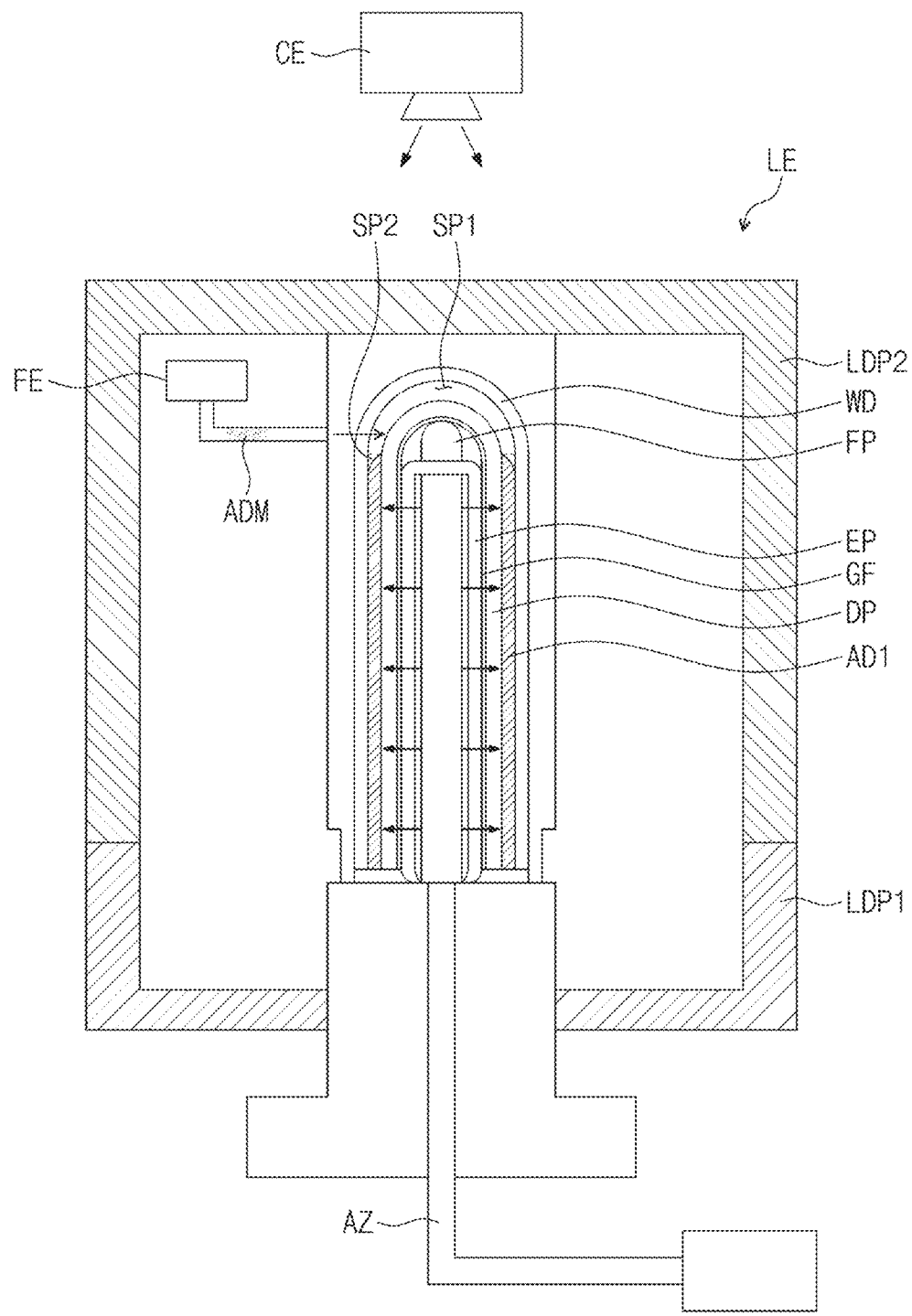

Referring to FIGS. 2A and 4D, when the expansion pad EP is completely extended from the top to the bottom, the first straight portion LP1 of the display panel DP is laminated to the second straight portion LP2 of the window WD by the first adhesive layer AD1. Also, the first space SP1 is defined between the first curved portion CP1 of the display panel DP and the second curved portion CP2 of the window WD. Also, the second space SP2 may be defined between the first adhesive layer AD1 and the second straight portion LP2 of the window WD.

An injection unit FE injects an adhesive material ADM into the first space SP1 and the second space SP2. The adhesive material ADM may be OCR. An amount of the adhesive material ADM injected by the injection unit FE may be determined according to the sizes of the first space SP1 and the second space SP2. Here, the gap between the first curved portion CP1 and the second curved portion CP2 remains constant by the fixed pad FP, and consequently, an amount of the adhesive material ADM injected by the injection unit FE into the first space SP1 between the first curved portion CP1 and the second curved portion CP2 may remain constant.

When the gap between the first curved portion CP1 and the second curved portion CP2 is about 0.5 millimeter (mm), about 1 gram (g) of the adhesive material ADM is injected, but the invention is not limited thereto. An amount to be injected may vary depending on the size of the display device DD or the like. Also, the viscosity of the adhesive material ADM to be injected may be high viscosity or low viscosity, and this may vary depending on the arrangement of the first adhesive layer AD1 within the first space SP1 or the like. In a case where the adhesive material ADM injected through the injection unit FE is disposed to the outside of the display device DD in addition to the first and second spaces SP1 and SP2, this may be removed through a separate cleaning process. A curing unit CE may cure the injected adhesive material ADM to form the second adhesive layer AD2. The second adhesive layer AD2 disposed therein may be an OCRL. The adhesive material ADM is an ultraviolet ("UV")-curable material, and the curing unit CE may emit UV light to the adhesive material ADM to form the second adhesive layer AD2. Here, the transmittance of the first adhesive layer AD1 in a solid film state is similar to the transmittance of the second adhesive layer AD2 provided by curing the adhesive material ADM in a liquid state, and thus, the first adhesive layer AD1 and the second adhesive layer AD2 may be not distinguished in appearance.

Figure 4E:
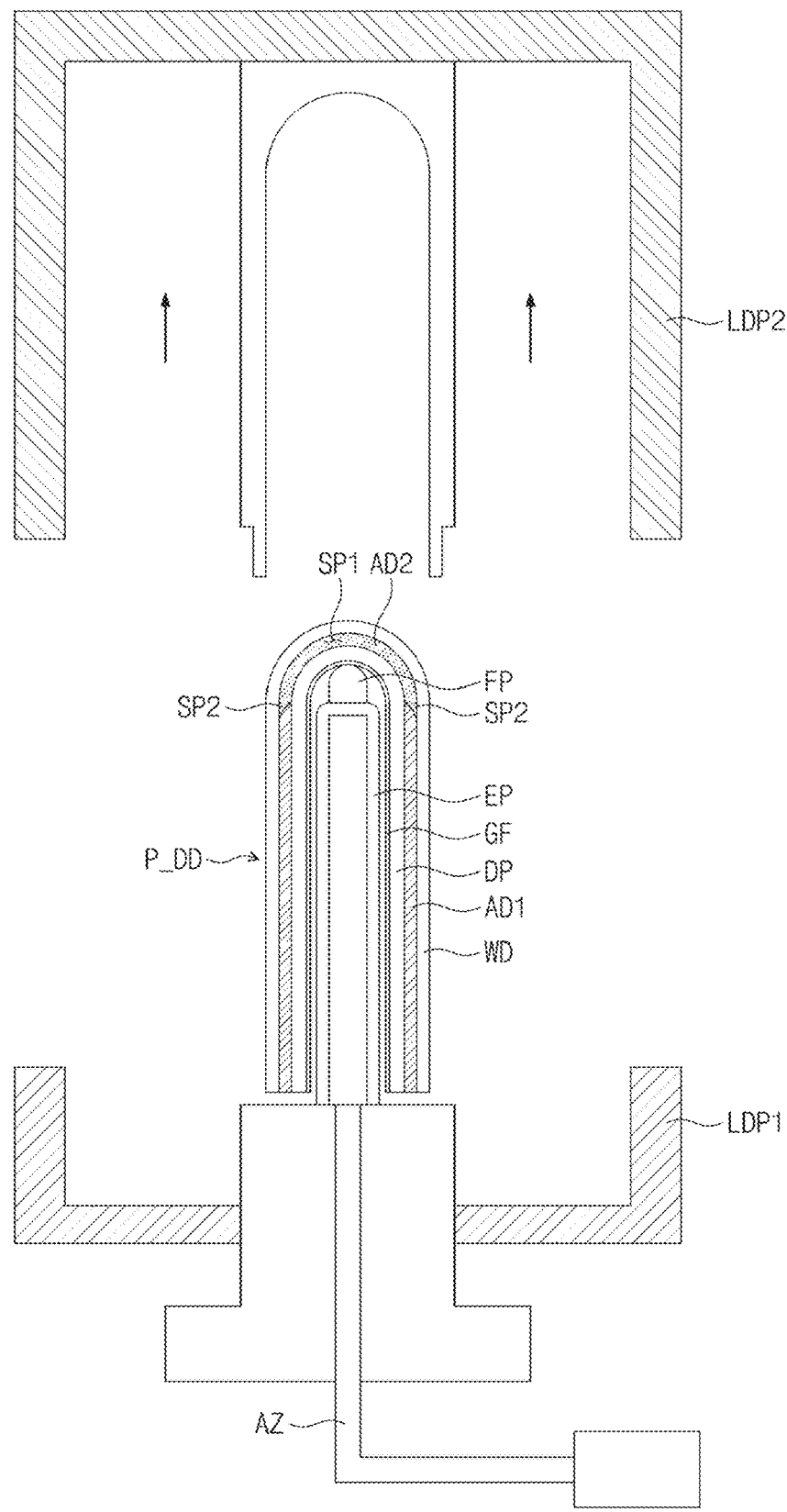

Referring to FIG. 4E, after the curing process using the curing unit CE, the first support unit LDP1 and the second support unit LDP2 are separated from each other. After separation, a preliminary display device P_DD manufactured by laminating the window WD and the display panel DP may be obtained from the first support unit LDP1. The display device DD illustrated in FIG. 2A may be completed by removing the guide film GF from the preliminary display device P_DD. In a case where the guide film GF is coupled to the display panel DP through the adhesive member, a process for reducing an adhesive force of the adhesive member may be performed prior to removal of the guide film GF. In one embodiment of the invention, the adhesive member may be a UV-reactive film, and the adhesive force of the adhesive member may be reduced when irradiated with UV light. In this case, the adhesive force of the adhesive member may be reduced by irradiating the adhesive member with the UV light prior to separating the guide film GF from the preliminary display device P_DD.

Figure 5A:
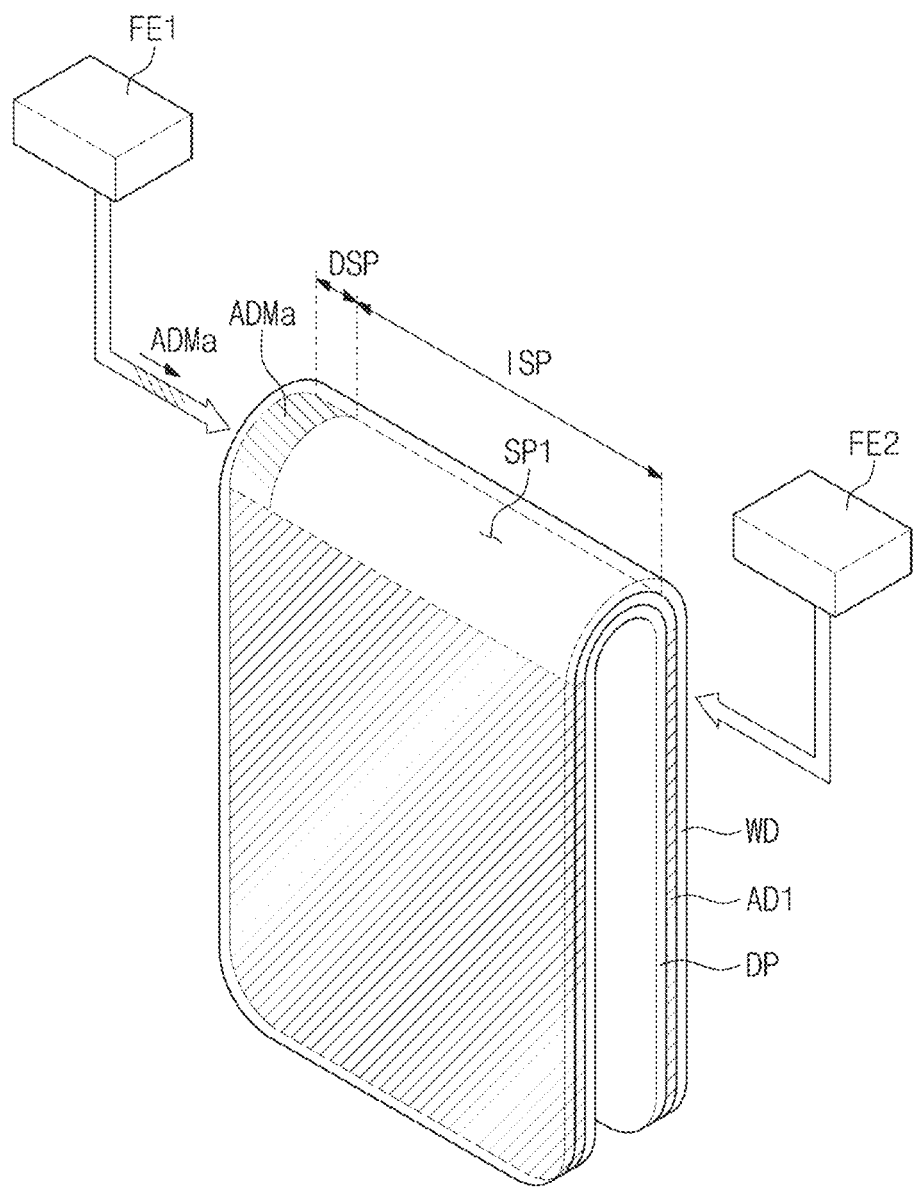
FIGS. 5A and 5B are process views illustrating an embodiment of a process of injecting an adhesive material using an injection unit according to the invention.
Figure 5B:
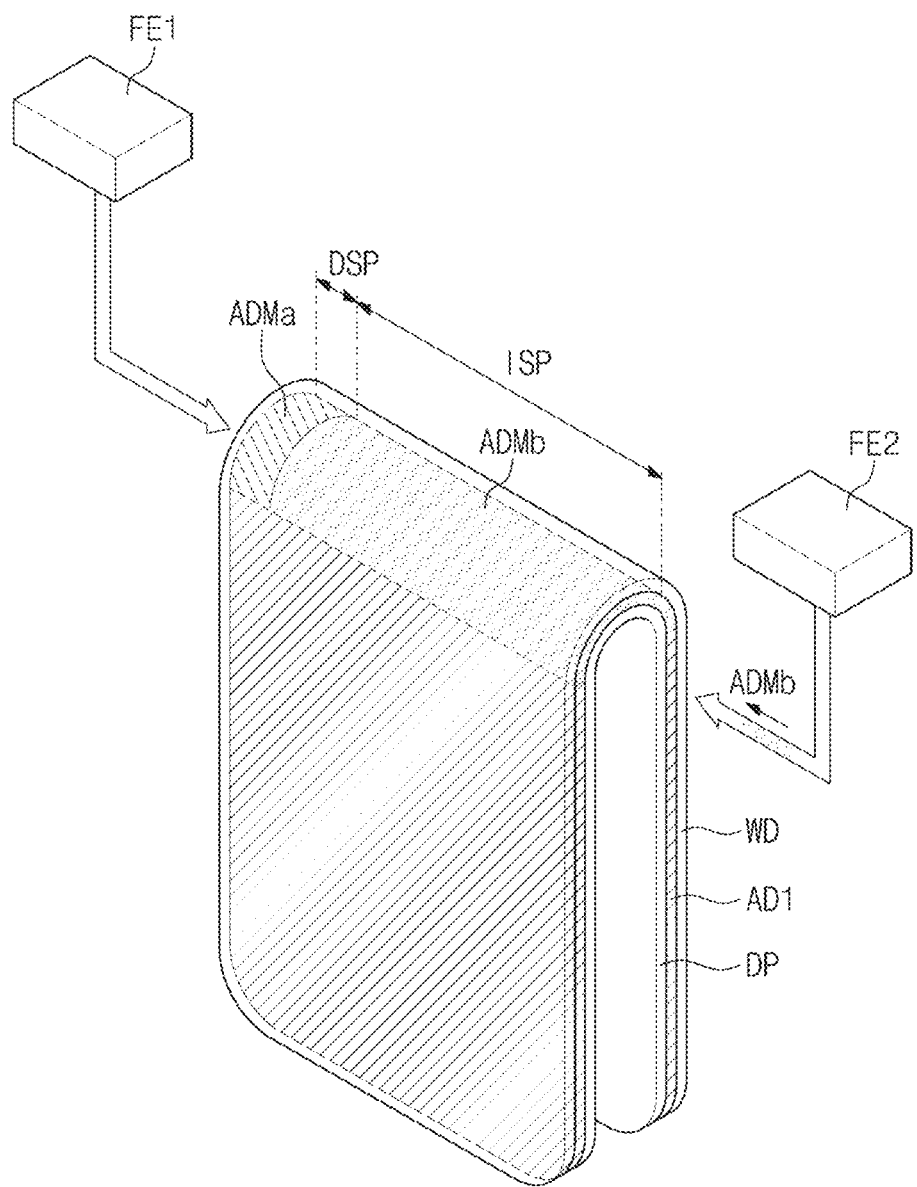

FIGS. 5A and 5B are process views illustrating a process of injecting an adhesive material using an injection unit according to the invention.

Referring to FIGS. 2A, 5A, and 5B, the injection unit FE (refer to FIG. 4D) includes a first injection unit FE1 and a second injection unit FE2. Corresponding to the curved area CA, the first space SP1 is defined between the first curved portion CP1 and the second curved portion CP2. The first space SP1 may include the dam formation space DSP corresponding to one end of the first curved portion CP1 and the injection space ISP corresponding to a region other than the dam formation space DSP.

The first injection unit FE1 injects a high-viscosity adhesive material ADMa into the dam formation space DSP, and the second injection unit FE2 injects a low-viscosity adhesive material ADMb, which has viscosity lower than that of the high-viscosity adhesive material ADMa, into the injection space ISP.

The high-viscosity adhesive material ADMa and the low-viscosity adhesive material ADMb may directly contact the first curved portion CP1 in the first space SP1. In this case, the first injection unit FE1 injects the high-viscosity adhesive material ADMa into a space between the second curved portion CP2 and the first curved portion CP1 within the dam formation space DSP. The second injection unit FE2 injects the low-viscosity adhesive material ADMb into a space between the second curved portion CP2 and the first curved portion CP1 within the injection space ISP.

Referring to FIGS. 3, 5A, and 5B, the first adhesive layer AD1 may be further disposed in curved area CA. In this case, the first injection unit FE1 injects the high-viscosity adhesive material ADMa into a space between the second curved portion CP2 and the first adhesive layer AD1 within the dam formation space DSP. The second injection unit FE2 injects the low-viscosity adhesive material ADMb into a space between the second curved portion CP2 and the first adhesive layer AD1 within the injection space ISP.

The first adhesive layer AD1 may be further disposed in the dam formation space DSP. In this case, in one embodiment of the invention, the first injection unit FE1 may be omitted, and the second injection unit FE2 may inject an adhesive material into a space between the second curved portion CP2 and the first curved portion CP1 within the injection space ISP. However, the invention is not limited thereto, and the second injection unit FE2 may further inject an adhesive material into a space between the first adhesive layer AD1 and the first curved portion CP1 within the dam formation space DSP. In this case, the adhesive material may be the low-viscosity adhesive material ADMb.

The high-viscosity adhesive material ADMa may be injected into the dam formation space DSP from one end of the first curved portion CP1 through the first injection unit FE1, and subsequently, the low-viscosity adhesive material ADMb may be injected into the injection space ISP from the other end of the first curved portion CP1 through the second injection unit FE2. When the high-viscosity adhesive material ADMa is injected, the high-viscosity adhesive material ADMa is not spread well but agglomerated in the dam formation space DSP. Subsequently, the low-viscosity adhesive material ADMb is injected. In a case where the high-viscosity adhesive material ADMa is injected into the injection space ISP, the injection time becomes longer because the high-viscosity adhesive material ADMa is not spread well. Accordingly, in order to shorten the process time, the low-viscosity adhesive material ADMb may be injected into the injection space ISP. The viscosity of the high-viscosity adhesive material ADMa may be about 60,000 cps, and the viscosity of the low-viscosity adhesive material ADMb may be about 500 cps.

Figure 6A:
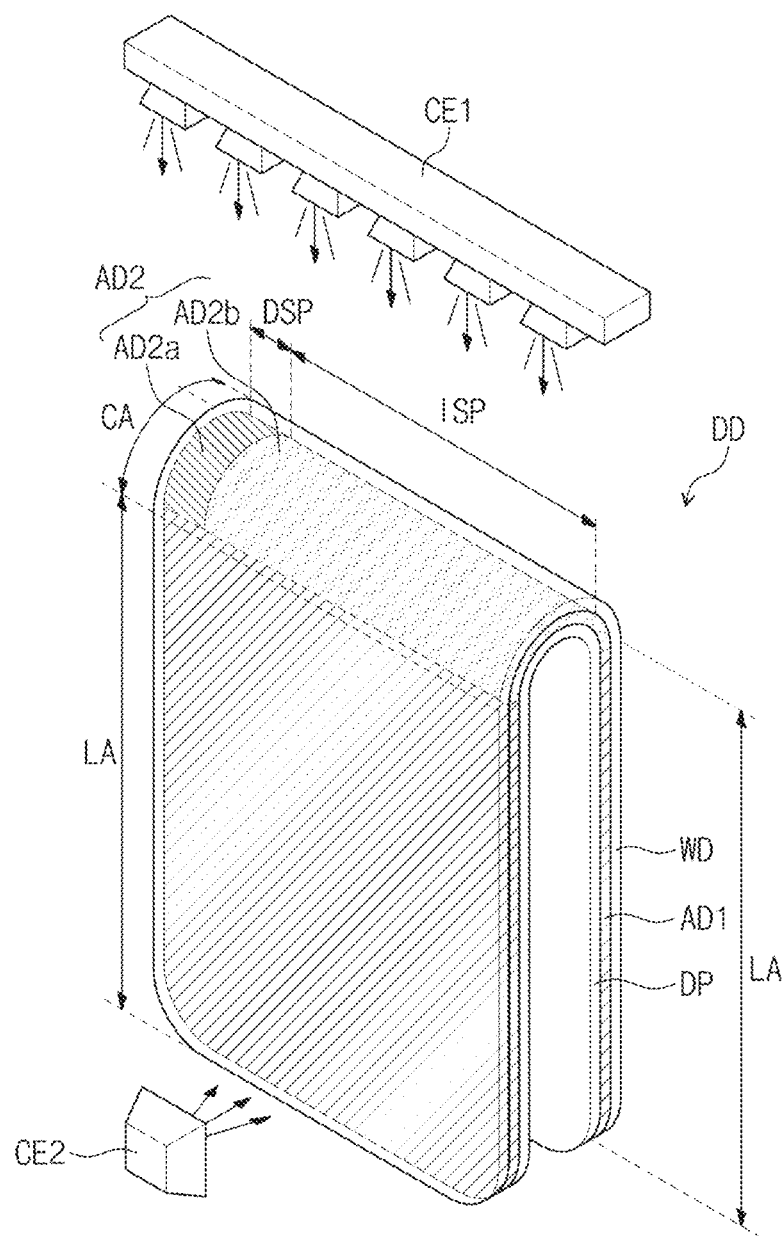
FIGS. 6A and 6B are process views illustrating an embodiment of a process of curing an injected adhesive material and a first adhesive layer using a curing unit according to the invention.
Figure 6B:
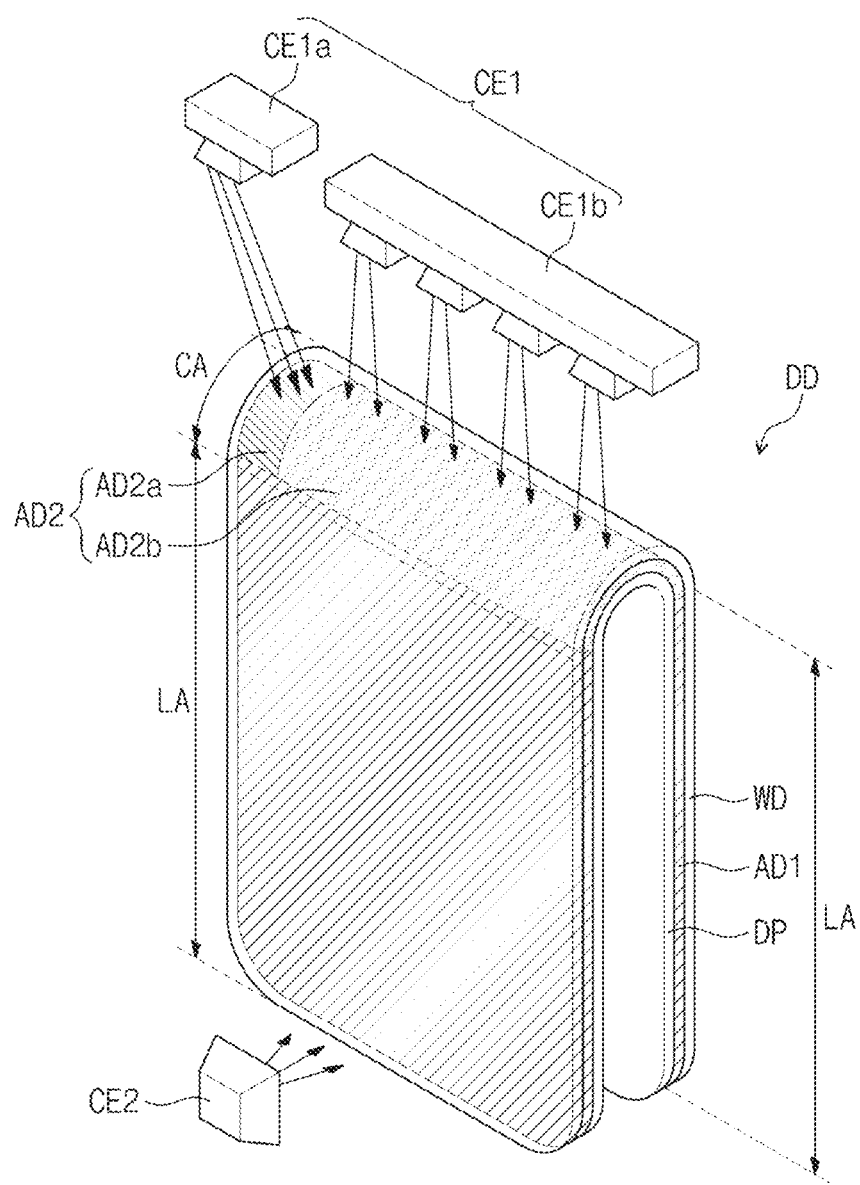

FIGS. 6A and 6B are process views illustrating a process of curing the injected adhesive material and the first adhesive layer according to the invention, using a curing unit.

Referring to FIGS. 5A and 6A, the curing unit CE (refer to FIG. 4D) may include a first curing unit CE1 and a second curing unit CE2.

The first curing unit CE1 may emit UV light to the high-viscosity adhesive material ADMa and the low-viscosity adhesive material ADMb, which are injected into the first space SP1, to form the second adhesive layer AD2. The first curing unit CE1 may emit the UV light to the high-viscosity adhesive material ADMa injected in the dam formation space DSP to form the high-viscosity adhesive layer AD2a. The first curing unit CE1 may emit the UV light to the low-viscosity adhesive material ADMb injected in the injection space ISP to form the low-viscosity adhesive layer AD2b. The forming of the high-viscosity adhesive layer AD2a by emitting the UV light to the dam formation space DSP using the first curing unit CE1 and the forming of the low-viscosity adhesive layer AD2b by emitting the UV light to the injection space ISP may be sequentially performed.

Referring to FIG. 6B, the first curing unit CE1 may include a first sub curing unit CE1a and a second sub curing unit CE1b. In this case, the first sub curing unit CE1a may emit the UV light to the high-viscosity adhesive material ADMa injected in the dam formation space DSP to form the high-viscosity adhesive layer AD2a. The second sub curing unit CE1b may emit the UV light to the low-viscosity adhesive material ADMb injected in the injection space ISP to form the low-viscosity adhesive layer AD2b.

The second curing unit CE2 may emit the UV light to the first adhesive layer AD1. The second curing unit CE2 may cure the first adhesive layer AD1 to laminate the display panel DP to the window WD. The first adhesive layer AD1 may include a UV-curable material. Also, in one embodiment of the invention, the second curing unit CE2 may emit the UV light to the first adhesive layer AD1 and the second adhesive layer AD2. The second curing unit CE2 may cure the first adhesive layer AD1 and the second adhesive layer AD2.

The curing of the first adhesive layer AD1 using the second curing unit CE2 may be performed after the curing of the high-viscosity adhesive material ADMa and the low-viscosity adhesive material ADMb using the first curing unit CE1. Also, the curing using the second curing unit CE2 may be performed after a process of removing bubbles on the first adhesive layer AD1. In one embodiment of the invention, the curing of the second adhesive layer AD2 using the second curing unit CE2 may be performed after the curing of the high-viscosity adhesive material ADMa and the low-viscosity adhesive material ADMb using the first curing unit CE1.

Figure 7:
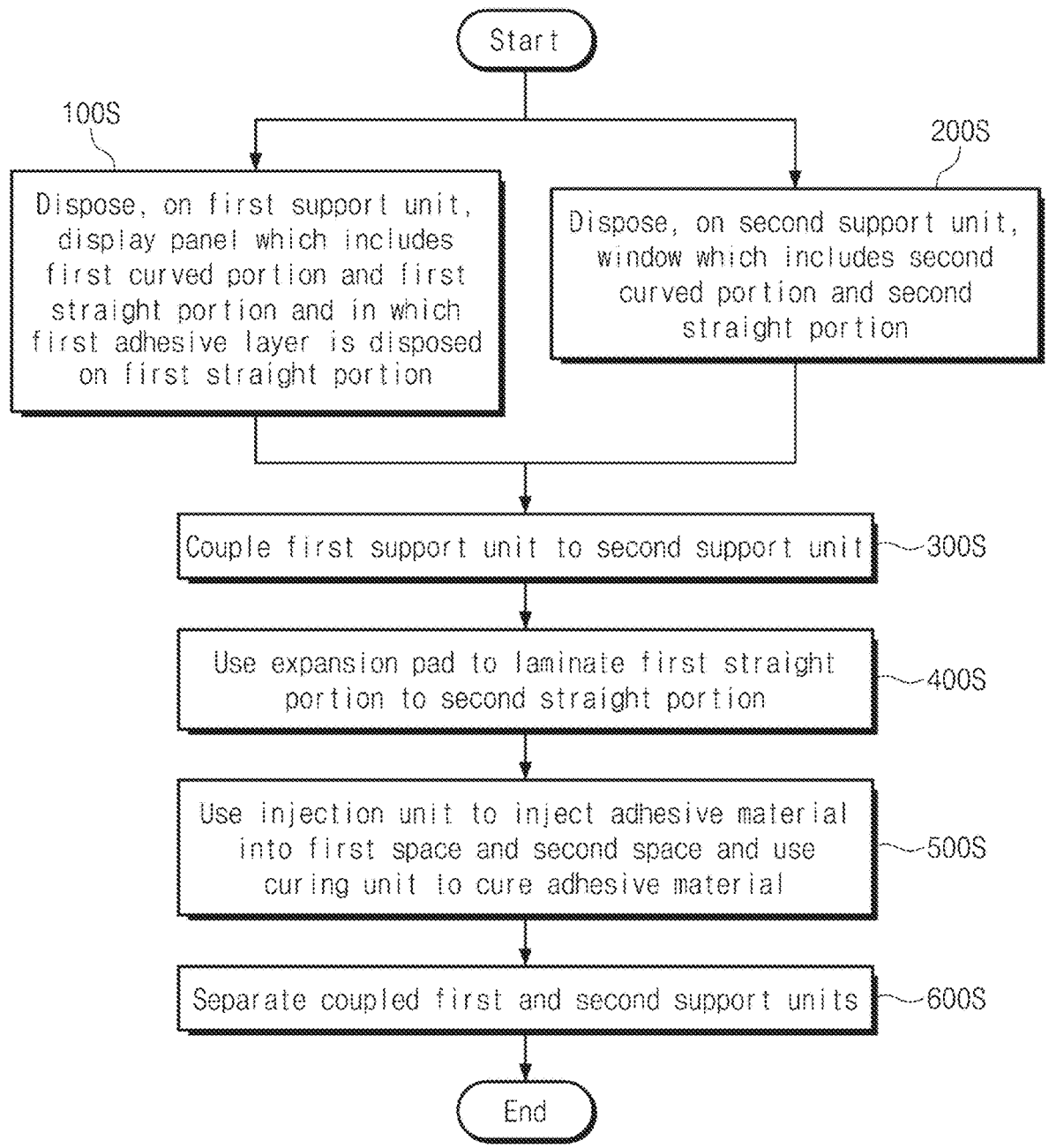
FIG. 7 is a flow chart illustrating an embodiment of a lamination method of a lamination device according to the invention.
Figure 8:
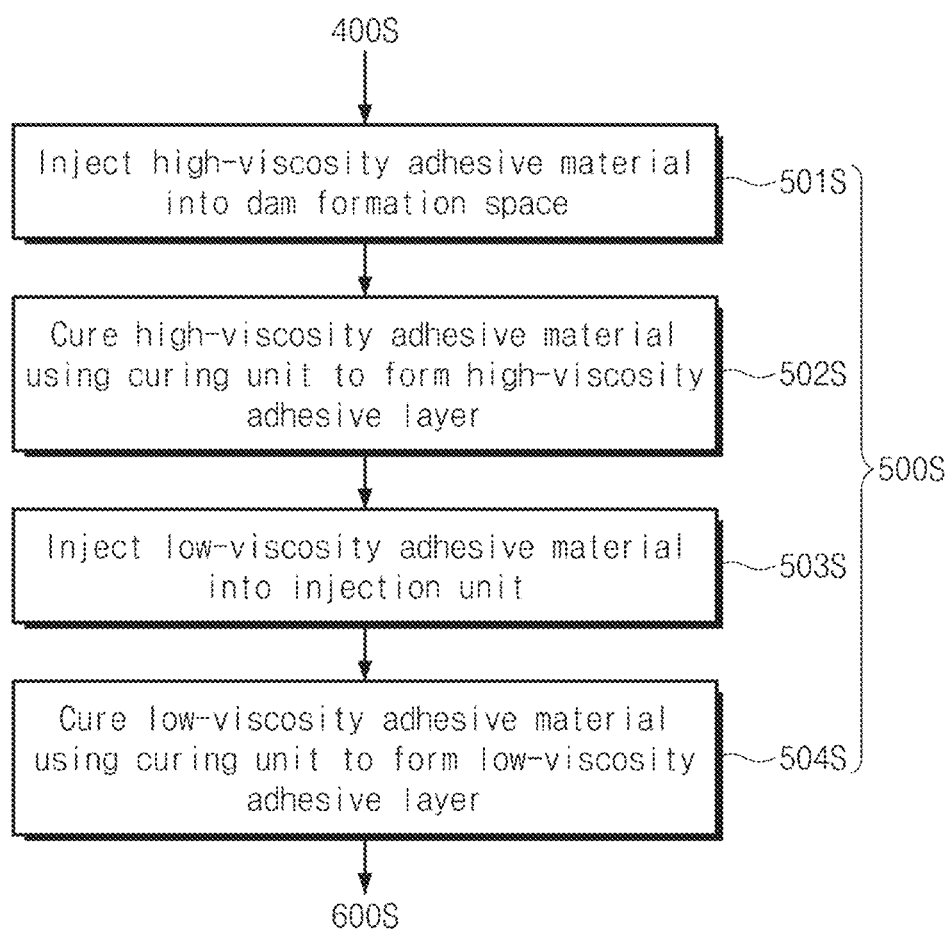
FIG. 8 is a flow chart showing an embodiment of injecting and curing of an adhesive material according to the invention.

FIG. 7 is a flow chart illustrating an embodiment of a lamination method of a lamination device according to the invention. FIG. 8 is a flow chart showing an embodiment of injecting and curing of an adhesive material according to the invention. Referring to FIGS. 4A to 4E and 7, a lamination method of the lamination device LE for manufacturing the display device DD includes a process (100S) of loading the display panel DP on the first support unit LDP1, a process (200S) of loading the window WD on the second support unit LDP2, and a process (300S) of coupling the first support unit LDP1 to the second support unit LDP2.

In the process (100S) of loading the display panel DP on the first support unit LDP1, the display panel DP may be loaded on the first support unit LDP1 in a state in which the first adhesive layer AD1 and the guide film GF are disposed on the display panel DP. However, the invention is not limited thereto, and the process (100S) of loading the display panel DP may include loading the display panel DP on the first support unit LDP1 and disposing the first adhesive layer AD1 on the first straight portion LP1 of the loaded display panel DP.

In the process (200S) of loading the window WD on the second support unit LDP2, the window WD, which includes the second curved portion CP2 that overlaps the curved area CA and the second straight portion LP2 that overlaps the straight area LA, may be loaded on the second support unit LDP2.

In the process (300S) of coupling the first support unit LDP1 to the second support unit LDP2, the first support unit LDP1 on which the display panel DP is loaded may be coupled to the second support unit LDP2 on which the window WD is loaded.

The lamination method of the lamination device further includes a process (400S) of using the expansion pad EP to laminate the first straight portion LP1 to the second straight portion LP2, a process (500S) of using the injection unit FE to inject an adhesive material ADM into the first space SP1 and the second space SP2 and using the curing unit CE to cure the adhesive material ADM, and a process (600S) of separating the coupled first and second support units LDP1 and LDP2.

In the process (400S) of using the expansion pad EP to laminate the first straight portion LP1 to the second straight portion LP2, air is injected to the expansion pad EP through the air nozzle AZ. When the expansion pad EP is expanded due to the injected air, the first straight portion LP1 of the display panel DP is moved to the second straight portion LP2 of the window WD and then laminated to the second straight portion LP2.

In the process (500S) of injecting the adhesive material ADM and curing the adhesive material ADM, the adhesive material ADM may be injected, by the injection unit FE, into the first space SP1 between the first curved portion CP1 and the second curved portion CP2 and the second space SP2 between the first adhesive layer AD1 and the second straight portion LP2. The injected adhesive material ADM may be cured by the curing unit CE.

Referring to FIGS. 5A to 6B and 8, the process (500S) of injecting the adhesive material ADM and curing the adhesive material ADM includes a process (501S) of using the injection unit FE to inject the high-viscosity adhesive material ADMa into the dam formation space DSP and a process (502S) of using the curing unit CE to cure the high-viscosity adhesive material ADMa to form the high-viscosity adhesive layer AD2a. Here, in one embodiment of the invention, the high-viscosity adhesive material ADMa may be injected by the first injection unit FE1 (501S), and the high-viscosity adhesive material ADMa may be cured by the first curing unit CE1 (502S).

The process (500S) of injecting the adhesive material ADM and curing the adhesive material ADM may further include a process (503S) of using the injection unit FE to inject the low-viscosity adhesive material ADMb into the injection space ISP and a process (504S) of using the curing unit CE to cure the low-viscosity adhesive material ADMb to form the low-viscosity adhesive layer AD2b. Here, in one embodiment of the invention, the low-viscosity adhesive material ADMb may be injected by the second injection unit FE2 (503S), and the low-viscosity adhesive material ADMb may be cured by the second curing unit CE2 (504S).

Referring back to FIG. 7, in the process (600S) of separating the coupled first and second support units LDP1 and LDP2, the coupled first and second support units LDP1 and LDP2 are separated from each other, and the preliminary display device P_DD (refer to FIG. 4E) manufactured by laminating the window WD and the display panel DP may be unloaded from the first support unit LDP1. Here, the guide film GF (refer to FIG. 4A) may be coupled to the preliminary display device P_DD through the adhesive member. After the unloading, the guide film GF may be removed from the preliminary display device P_DD. After the process (600S) of separating the first support unit LDP1 from the second support unit LDP2, the UV light is emitted to the adhesive member coupled to the preliminary display device P_DD to reduce the adhesive force of the adhesive member, and subsequently, the guide film GF from the preliminary display device P_DD are separated from each other. The display device DD illustrated in FIG. 2A may be completed by removing the guide film GF from the preliminary display device P_DD.

According to the embodiment of the invention, the space defined when the curved window and the display panel are laminated may be filled with the adhesive layer. Accordingly, the transmittance in a curved section of the display device having the curved shape may be prevented from deteriorating.

Although described with reference to embodiments of the invention, it will be understood that various changes and modifications of the invention may be made by one ordinary skilled in the art or one having ordinary knowledge in the art without departing from the spirit and technical field of the invention as hereinafter claimed.

Hence, the technical scope of the invention is not limited to the detailed descriptions in the specification.

What is claimed is:

1. A display device in which a curved area having a curved shape and a straight area having a planar shape are defined, the display device comprising:
   a display panel which comprises a first curved portion overlapping the curved area and a pair of first straight portions overlapping the straight area, the first curved portion is disposed between the pair of first straight portions;
   a window which is disposed on the display panel and comprises a second curved portion overlapping the curved area and a pair of second straight portions overlapping the straight area, the second curved portion is disposed between the pair of second straight portions; and an adhesive layer disposed between the display panel and the window, the adhesive layer comprising:
- a first adhesive layer which is disposed between the first straight portions and the second straight portions and couples the first straight portions to the second straight portions; and
- a second adhesive layer which is disposed in a first space between the first curved portion and the second curved portion and a second space between the first adhesive layer and the second straight portions, wherein a viscosity of the adhesive layer overlapping the curved area is variable depending on the position.

2. The display device of claim 1, wherein the first space comprises a dam formation space corresponding to an end of the first curved portion and an injection space corresponding to a region other than the dam formation space.

3. The display device of claim 2, wherein the first space comprises a space in which the second adhesive layer and the first curved portion are in direct contact with each other.

4. The display device of claim 3, wherein the first adhesive layer is further disposed in the dam formation space.

5. The display device of claim 4, wherein the second adhesive layer is disposed between the second curved portion and the first adhesive layer within the dam formation space and is disposed between the second curved portion and the first curved portion within the injection space.

6. The display device of claim 3, wherein the second adhesive layer comprises:
- a high-viscosity adhesive layer disposed in the dam formation space; and
- a low-viscosity adhesive layer which is disposed in the injection space and has the viscosity lower than a viscosity of the high-viscosity adhesive layer.

7. The display device of claim 2, wherein the first adhesive layer is further disposed in the curved area.

8. The display device of claim 7, wherein the second adhesive layer is disposed between the second curved portion and the first adhesive layer within the first space.

9. The display device of claim 8, wherein the second adhesive layer comprises:
- a high-viscosity adhesive layer disposed in the dam formation space; and
- a low-viscosity adhesive layer which is disposed in the injection space and has the viscosity lower than the viscosity of the high-viscosity adhesive layer.

* * * * *